United States Patent [19]

Lei et al.

[11] Patent Number: 5,556,476

[45] Date of Patent: Sep. 17, 1996

[54] CONTROLLING EDGE DEPOSITION ON SEMICONDUCTOR SUBSTRATES

[75] Inventors: Lawrence C. Lei, Milpitas; Cissy Leung, Fremont, both of Calif.

[73] Assignee: Applied Materials, Inc., Santa Clara, Calif.

[21] Appl. No.: 327,462

[22] Filed: Oct. 21, 1994

Related U.S. Application Data

[63] Continuation-in-part of Ser. No. 200,862, Feb. 23, 1994.

[51] Int. Cl.$^6$ .................. C23C 16/00; B44C 1/22
[52] U.S. Cl. .................. 118/728; 156/345; 156/643.1; 204/298.07; 204/248.33; 427/569
[58] Field of Search .................. 118/728, 723 E, 118/725, 724, 723 MP, 723 MW; 156/345, 643.1; 204/298.09, 298.15, 298.33, 298.07; 427/569

[56] References Cited

U.S. PATENT DOCUMENTS

| 4,738,748 | 4/1988 | Kisa | 156/643 |
|---|---|---|---|
| 4,810,342 | 3/1989 | Inoue | 204/192.17 |
| 4,911,812 | 3/1990 | Kudo et al. | 204/192.32 |
| 4,956,043 | 9/1990 | Kanetomo et al. | 156/345 |
| 4,960,488 | 10/1990 | Law et al. | 156/643 |
| 5,085,750 | 2/1992 | Soraoka et al. | 204/192.32 |
| 5,133,284 | 7/1992 | Thomas et al. | 118/719 |
| 5,238,499 | 8/1993 | van de Ven et al. | 118/724 |
| 5,374,594 | 12/1994 | van de Ven et al. | 437/247 |
| 5,423,936 | 6/1995 | Tomita et al. | 156/345 |
| 5,494,523 | 2/1996 | Steger et al. | 118/723 E |

FOREIGN PATENT DOCUMENTS

| 0467623 | 7/1991 | European Pat. Off. . |
| 0619381 | 3/1994 | European Pat. Off. . |

OTHER PUBLICATIONS

Patent Abstract of Japan vol. 16 No. 372 (E–1246), 11 Aug. 1992 & JP–A–04 119630 (Mitsubishi Electric Corp.) 21 Apr. 1992.

*Primary Examiner*—R. Bruce Breneman
*Assistant Examiner*—Joni Y. Chang
*Attorney, Agent, or Firm*—Craig P. Opperman, Esq.

[57] ABSTRACT

A substrate processing apparatus comprising a housing defining a processing chamber for receiving a substrate therein. Inside the chamber a substrate supporting susceptor, including an upper substrate receiving portion is located. The receiving portion defines a walled pocket dimensioned to receive the substrate therein. When the substrate is so received the walls of the pocket define an annulus with the outer edge of the substrate. Typically the pocket walls are perpendicular to a primary plane of the substrate and are at least as high, and preferably twice as high, as the substrate is thick. At the outer, circumferential edge of the pocket a gas manifold is formed. The manifold is arranged so that, during processing, a gas which can be projected toward the edge of a substrate received in the pocket. This gas moves upwards between the annulus defined between the wall of the pocket and the outer edge of the substrate, thereby preventing processing gas from contacting the edge portion of the substrate.

25 Claims, 8 Drawing Sheets

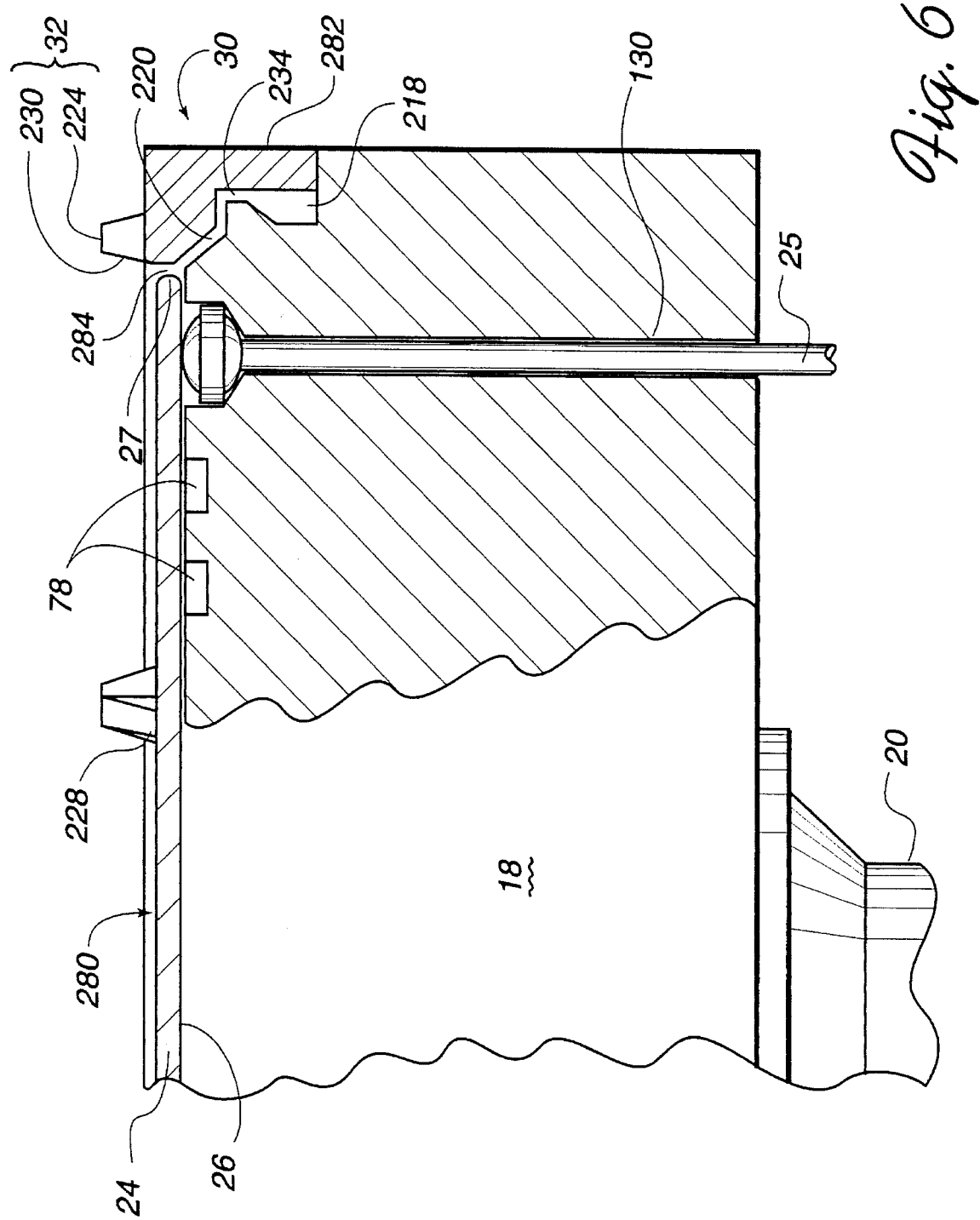

CONTROLLING EDGE DEPOSITION ON SEMICONDUCTOR SUBSTRATES

CROSS-REFERENCE TO RELATED APPLICATIONS

This application is a continuation in part of co-pending U.S. patent application Ser. No. 08/200,862 filed on Feb. 23, 1994 under Applied Materials Docket No. 462A and entitled "Improved Chemical Vapor Deposition Chamber."

BACKGROUND OF THE INVENTION

1. Field of the Invention

This invention relates to the deposition of layers of materials on substrates used in the manufacture of semiconductor integrated circuits. More particularly, the invention relates to controlling the deposition of materials at the edges of semiconductor substrates.

2. Background

Chemical vapor deposition, commonly referred to as "CVD," is one of a number of processes used to deposit thin layers of material on a semiconductor substrate. To process deposit substrates with the CVD process, a vacuum chamber is provided with a susceptor configured to receive a substrate thereon. In a typical prior art CVD chamber, the substrate is placed into and removed from the chamber by a robot blade and is supported by the susceptor during processing. Prior to processing, however, the susceptor and the substrate are heated to a temperature of between 250°–650° C. Once the substrate is heated to an appropriate temperature, a precursor gas is charged to the vacuum chamber through a gas manifold typically situated above the substrate. The precursor gas reacts with the heated substrate surface to deposit the thin material layer thereon. As the gas thermally reacts to form the material layer, volatile byproduct gasses are formed, and these gasses are pumped out of the vacuum chamber through a chamber exhaust system.

A primary goal of substrate processing is to obtain as many useful die as possible from each substrate. Many factors influence the processing of substrates in the CVD chamber and affect the ultimate yield of die from each substrate processed therein. These factors include processing variables, which affect the uniformity and thickness of the material layer deposited on the substrate, and contaminants that can attach to a substrate and contaminate one or more die therein. Both of these factors must be controlled in CVD and other processes to maximize the die yield from each substrate.

One of the causes of particulate contaminants in the chamber is improper deposition at the edge of the substrates. Because edge deposition conditions are difficult to control, due in part to the fact that substrates edges are typically chamfered and deposition gas flow is non-uniform around these edges, non-uniform deposition can occur around a substrate's edge. This may lead to deposited layers not adhering properly to each other and/or not adhering properly to the substrate.

This problem is illustrated in FIG. 1(a) which is a schematic partial cross-section of a semiconductor substrate. The substrate 1 is shown with three consecutive layers 2, 3 and 4 deposited thereon. In the deposition of tungsten on the substrate (using $WF_6$ gas) the first layer 2 could typically be titanium, the second layer 3 would be titanium nitride and the third (upper) layer 4 would be tungsten.

Such a three-layer process for the deposition of tungsten is common as tungsten does not readily adhere to the silicon (or oxidized silicon) surface of the substrate. Accordingly a very thin "primer" layer 2 of titanium is deposited, followed by a second layer 3 of titanium nitride. Tungsten readily adheres to titanium nitride (TIN). As can be seen from FIG. 1(a), however, the tungsten layer 4 has "wrapped" around onto the beveled outer edge 5 of the substrate to contact directly with the silicon substrate.

The problem with this is that tungsten does not adhere to the silicon substrate surface and could readily chip and flake, during the handling of the substrate, resulting in particulate contaminants.

An idealized edge cross-section is, therefore, that illustrated in FIG. 1(b) in which all three layers terminate at the same or close to the same point with respect to the substrate's edge with the tungsten layer 4 being the furthest back from the edge of the substrate.

One solution to this problem is to provide a shadow ring which is located over and masks a narrow, peripheral area of the substrate to prevent deposition thereon. This, however, has the disadvantage that the ultimate yield by the substrate is reduced because its usable area is smaller. It is also inappropriate to use a shadow ring in situations where the entire upper surface of the substrate must be deposited on.

The need therefore exists for a method and apparatus for controlling the deposition of materials at or around the edge of a semiconductor substrate during CVD and/or other substrate processing operations.

SUMMARY OF THE INVENTION

Briefly, therefore, this invention provides for a substrate processing apparatus comprising a housing defining a processing chamber for receiving a substrate therein. Inside the chamber a substrate support, and it includes on its side a substrate receiving portion is located. The receiving portion defines a walled pocket dimensioned to receive the substrate therein. When the substrate is so received, the walls of the pocket define an annulus with the outer edge of the substrate. Typically the pocket walls are perpendicular to a primary plane of the substrate and are at least as high, and preferably twice as high, as the substrate is thick.

At the outer, lower, circumferential edge of the pocket a gas injection manifold is located. The manifold is arranged so that, during processing, gas is injected through the manifold and projected toward the edge of a substrate received in the pocket. This gas moves upwards through the annulus defined between the wall of the pocket and the outer edge of the substrate. Consequently, processing gas is prevented from contacting the extreme edge portion of the substrate.

The substrate support may be a heater pedestal and the pocket may be defined by a circular ring secured to the top of the pedestal.

The floor of the pocket may further include vacuum ports formed therein, whereby a vacuum can be drawn at the interface between the pocket floor and the underside of a substrate received thereon, thereby causing the substrate to be drawn onto the pedestal to improve processing.

Other features and further details of the present invention will become apparent from the following detailed description when taken in conjunction with the accompanying drawings.

BRIEF DESCRIPTION OF THE DRAWINGS

In the accompanying drawings:

FIG. 6 is a partial sectional view of the upper portion of the pedestal and taken along line 6—6 in FIG. 5.

DESCRIPTION OF THE INVENTION

Introduction

Figure 1A:
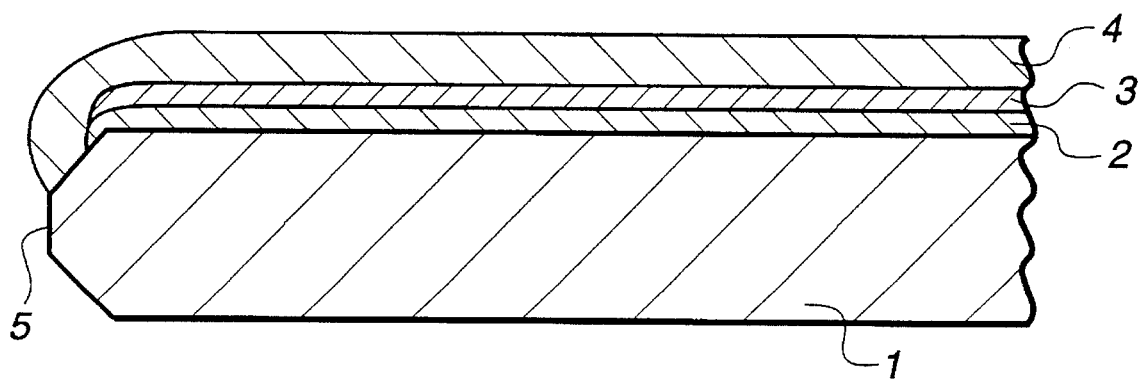
FIGS. 1(a) and (b) are partial cross-sections of a semiconductor substrate illustrating non-ideal and ideal deposition of material layers at the edge of the substrate.

Referring in general to FIGS. 2 to 7, the CVD processing reactor 10 of the present invention includes multiple features and embodiments, which may be used independently, or concurrently, to provide improvements in the structure and operation of substrate processing chambers. In these figures, the cooperation and interaction of several features are shown, including an internally heated substrate support pedestal 18 and a substrate edge protection system 30 in the form of a purge gas channel 220 which operates in conjunction with a substrate receiving pocket 280 to reduce the occurrences of unwanted substrate edge and underside deposition. The pocket 280 can be formed into the surface of the pedestal 18 or, as illustrated, can be defined by a circumferential hoop 282 (FIG. 6) welded or otherwise attached to the outer perimeter of the pedestal 18.

Other features include a substrate alignment system 32 in the form of a plurality of alignment pins 224 on the upper surface of the heater pedestal 18, and an improved chamber exhaust system 300.

The heater pedestal 18 is actuable upwardly within reactor 10 to hold a substrate 24 within the pocket 280 and downwardly in reactor 10 to position the substrate 24 for removal from reactor 10. To position the substrate 24 in the pocket 280, a plurality of support pins 25 move relative to the pedestal 18. As illustrated in detail in FIGS. 6 and 7, when the substrate is received in the pocket 280 an annulus 284 is defined between the outer edge 27 of the substrate 24 and the inner face of the circumferential hoop 282.

The support pins 25 pass through the body of the heater pedestal 18 and may be extended from the heater pedestal 18 to receive the substrate 24 as it is placed in the reactor 10 by a robot blade (not illustrated). The heater pedestal 18 may move upwardly with respect to the support pins 25 to engage the substrate 24 in the pocket 280 for processing, and downwardly with respect to the support pins 25 to position the substrate 24 above it for removal of the substrate 24 from the reactor 10 by the robot blade.

Figure 1B:
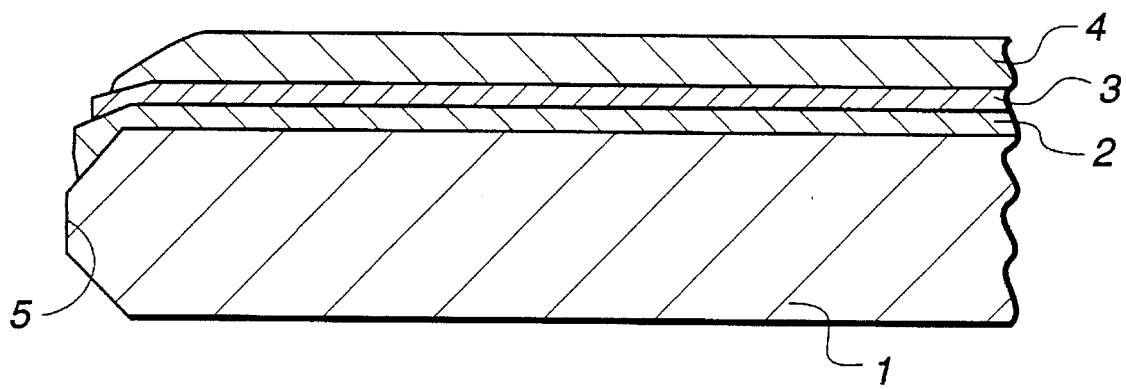

To reduce the deposition of material on the substrate underside and edge, heater pedestal 18 includes an edge protection system 30, preferably in the form of a circumferential purge gas channel 220 defined between the main body of the pedestal and the hoop 282 to open in the floor of the pocket 280 and positioned adjacent the outer edge 27 of the substrate 24 when the substrate 24 is received in the pocket 280. Once the substrate 24 is located in the pocket 280 and processing begins, a continuous flow of purge gas is provided to channel 220 to flow through the annulus 284 and about the entire edge 27 of the substrate 24. The purge flow has the effect that little, or no, deposition occurs on the edge 27 of the substrate 24, or on the underside of the substrate 24 immediately adjacent the edge 27. The resulting configuration of deposited layers of material would resemble that illustrated in FIG. 1(b).

To fully exploit the purge gas channel 220, the position of the substrate 24 within the pocket 280 is critical, as any gross misalignment places a portion of the substrate 24 edge in a position which obstructs gas flowing out from the channel 220. Therefore, the heater pedestal 18 includes a substrate alignment system 32, which includes a plurality of tapered guide pins 224 provided above channel 220 along the perimeter thereof to guide the substrate 24 onto the heater pedestal 18. As the heater pedestal 18 approaches the substrate 24 supported over it on support pins 25, if the substrate 24 is out of alignment some portion of the substrate's edge 27 engages one or two of the guide pins 224. This aligns the entire circumference of the substrate 24 in the proper position with respect to the pocket and the purge gas channel 220 to ensure passage of purge gas over the entire edge 27 of the substrate 24.

During processing, the substrate 24 is typically maintained at an elevated temperature. To establish and maintain this temperature, the heater pedestal 18 of the present invention includes a resistive heating element for heating, the heater pedestal 18, in turn, heats the substrate. As the substrate is heated to the processing temperature, thermal expansion of the substrate may cause the substrate edge 27 to press against one or more of the guide pins 224, and if significant thermal expansion occurs, the substrate edge 27 may chip. To address this problem, a reduced vacuum can be maintained in the plurality of vacuum grooves 77, 78, which are provided in the floor of pocket 280 to draw the substrate 24 down onto the heater pedestal 18 and to chuck it there during processing.

To increase the uniformity of the exhaust of reacted gaseous products within the reactor 10, an exhaust manifold 23 on the circumference of the reactor 10 is covered by a pumping plate 308, which includes a series of spaced apertures 29 formed therein between the manifold 23 and the interior of the chamber between the substrate and the shower supplying the reaction gas. The apertures 29 are evenly spaced about the entire circumference of the manifold 23, and the plate 308 spans the gap in the manifold 23 created by the presence of a slit valve 11 in the chamber wall, to increase the uniformity of the removal of reacted gaseous products from the chamber.

The Processing Chamber

Figure 2:
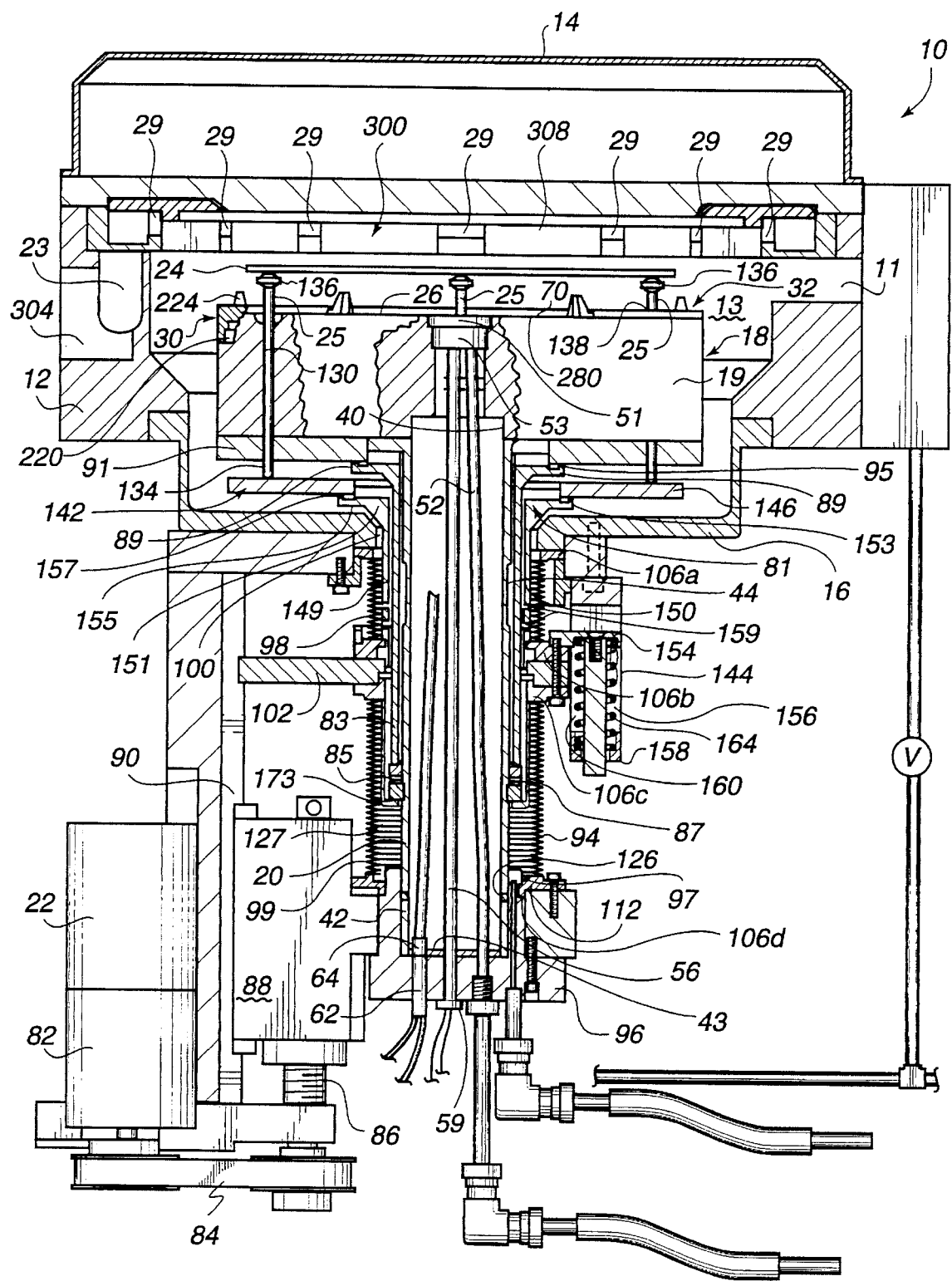
FIG. 2 is a sectional view of the processing apparatus of the present invention.
Figure 3:
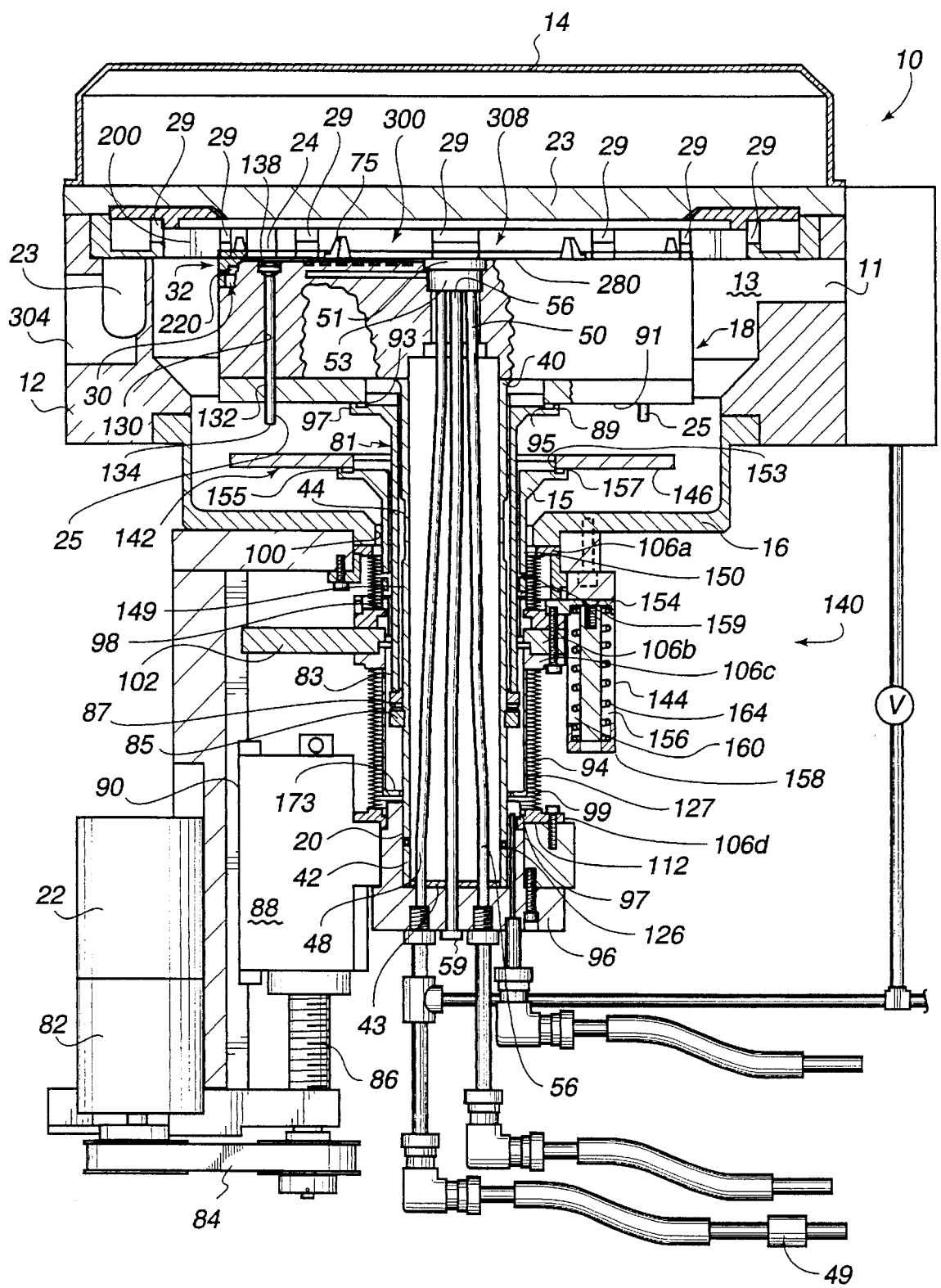
FIG. 3 is a further sectional view of the processing apparatus.

Referring now to FIGS. 2 and 3 together, the multiple improvements and features of the reactor 10 of the present invention are shown in a CVD processing apparatus. In FIGS. 2 and 3, the reactor 10 is shown in partial cutaway to show the interaction and interconnection of the improvements and features of the reactor 10. In FIG. 2, the reactor 10 is shown with the heater pedestal 18 in the retracted position, wherein a substrate 24 may be positioned on, or removed from, the heads of the support pins 24 which extend from the upper surface of the heater pedestal 18. In FIG. 3, the apparatus is shown with the heater pedestal 18 in the extended position with the support pins 25 sunk into the floor 26 of the pocket 280 to position the substrate 24 in the pocket for processing. Although the features and improvements of the reactor 10 are shown in FIGS. 2 or 3, the discussion of these features may include other Figures necessary to show the details of the features and improvements.

As shown, the CVD processing apparatus includes a reactor 10 having an outer wall 12, a cover 14 and a base 16 which form an evacuable chamber 13 in which the vertically-moveable substrate-receiving heater pedestal 18 is located. Heater pedestal 18 is moveable within chamber 13 to position a substrate 24 within pocket 280 for processing. Heater pedestal 18 preferably includes the substrate edge protection system 30 as an integral part thereof.

The Heater Pedestal and Stem Assembly

The heater pedestal 18 is moveable vertically in the chamber 13 under action of a stem 20, which is connected to the underside of heater pedestal 18 and extends outwardly through the base 16 of the chamber 13 where it is connected to the drive system 22. The stem 20 is preferably a circular, tubular, aluminum member, having an upper end 40 disposed in supporting contact with the underside of the heater pedestal 18 and a lower end 42 closed off with a cover plate 43. The stem lower end 42 is received in a cup shaped sleeve 96, which forms the connection of the stem 20 to the drive system 22. To provide connections from the exterior of the chamber into the heater pedestal 18, cover plate 43 and sleeve 96 include a plurality of aligned apertures therein, through which the heater plate connections are maintained. Stem 20 mechanically positions the heater pedestal 18 within the chamber 13 and also forms an ambient passageway through which a plurality of heater plate connections extend.

The heater pedestal 18 is configured to provide heat to a substrate 24 received on the floor 26 in the pocket 280, while minimizing the heat transfer therefrom along the stem 20. The heater pedestal 18 is preferably a solid aluminum member, which is welded to the upper end 40 of stem 20. Preferably, the heater plate is heated by a resistive heating element located therein, to provide sufficient heat to maintain the pocket floor 26 of the heater pedestal 18 at elevated processing temperatures of between 250 and 650 degrees celsius. To power the heating element, the element preferably includes a downwardly projecting tubular portion, which terminates in a blade type connector 64 in the cover plate 43. A mating blade connector 62 is located in the sleeve 96, to mate with, and provide electric power to, the connector 64 in the cover plate 43.

The Heater Pedestal Thermocouple Connection

Referring to FIG. 3, a thermocouple 56 provided in heater pedestal 18 monitors the temperature thereof. The heater pedestal 18 includes a bore 50, extending upwardly therein and terminating adjacent, but interiorly of, the pocket floor 26. This bore 50 provides a pilot to receive the end of the thermocouple 56 therein, and also provides an aperture for the receipt of the purge gas and vacuum supplies into the heater pedestal 18. The bore is preferably formed by boring a through hole in the pocket floor 26, and extending a plug 51 and a connector housing 53 into the bore. The upper surface of the bore 51 may be slightly recessed from the floor 26 of the pocket 280, or may be ground or otherwise configured to provide a continuous floor 26. The connector housing 53 and the plug 51 may be formed as separate elements, or as one continuous element. The thermocouple 56 is configured as a rigid rod, which extends through a pair of aligned apertures in the cover plate 43 and the sleeve 96, and terminates within the bore 50 in contact with the solid mass of the heater pedestal 18 and/or the connector housing 53. The lower end of the rigid rod includes a bracket 59, which is releasably attached to the exterior of the sleeve 96, to maintain the thermocouple 56 in position in the heater plate bore 50. Preferably, the bracket is maintained on the exterior of the sleeve 96 by a plurality of screws, but other attachment means, such as clamps or spring clips, may be substituted for the screws. The thermocouple 56 is connected to an amplifier and a filter for displaying temperature display and protecting against over-heating. To ensure that air is present in the bore 50, the rigid rod may be slightly smaller in diameter than the aligned apertures about the thermocouple 56 and thus be present about thermocouple 56 within the bore 50 in the heater pedestal 18 to increase the heat transfer between the mass of the heater pedestal 18 and the thermocouple 56 to increase the accuracy and response time of the thermocouple.

The Purge and Vacuum Supplies

Referring now to FIG. 3, the purge gas supply for supplying a protective gas to the substrate edge protection system 30 is shown. Purge gas pipe 52 (FIG. 2) extends through stem 20, from cover plate 43 to the connector housing 53 in the heater pedestal 18. The connector housing 53 includes a plurality of bores therein, which register with purge gas and vacuum bores in the heater pedestal 18. A purge gas bore 70 extends within the heater pedestal 18, and into a corresponding bore in tho connector housing 53, to supply purge gas from the connector housing 53 along the channel 220 and through the annulus 284 defined between the substrate's outer edge 27 and the inner face of the circumferential hoop 282. In the preferred substrate edge protection system, the bore 70 supplies purge gas to a manifold 218 which is ported to a plurality of purge gas apertures 234 extending through the body of heater pedestal 18 into channel 220 as shown in FIGS. 6 and 7.

Figure 4:
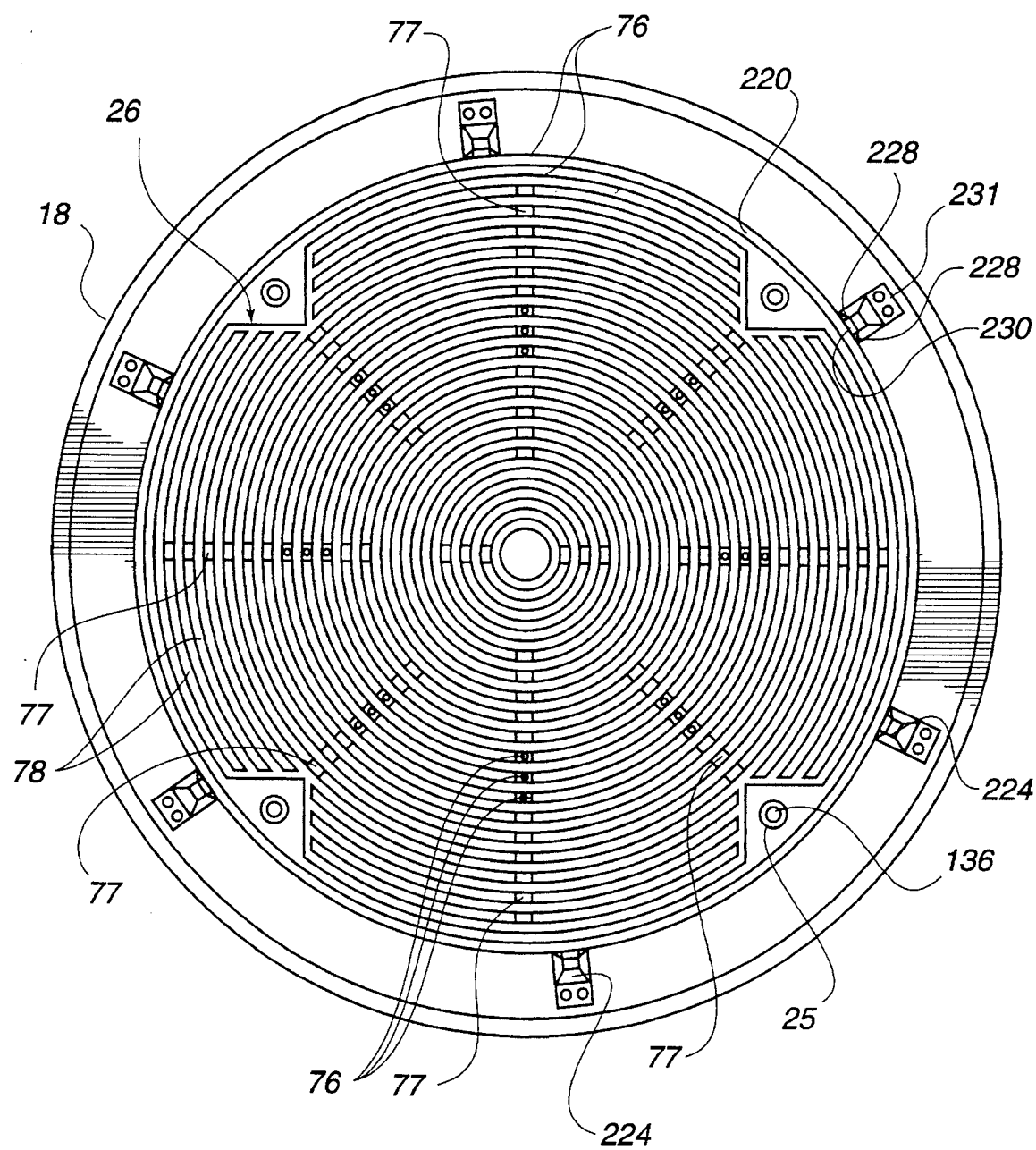
FIG. 4 is a top view of the heater pedestal disposed in the chamber of FIGS. 2 and 3.
Figure 5:
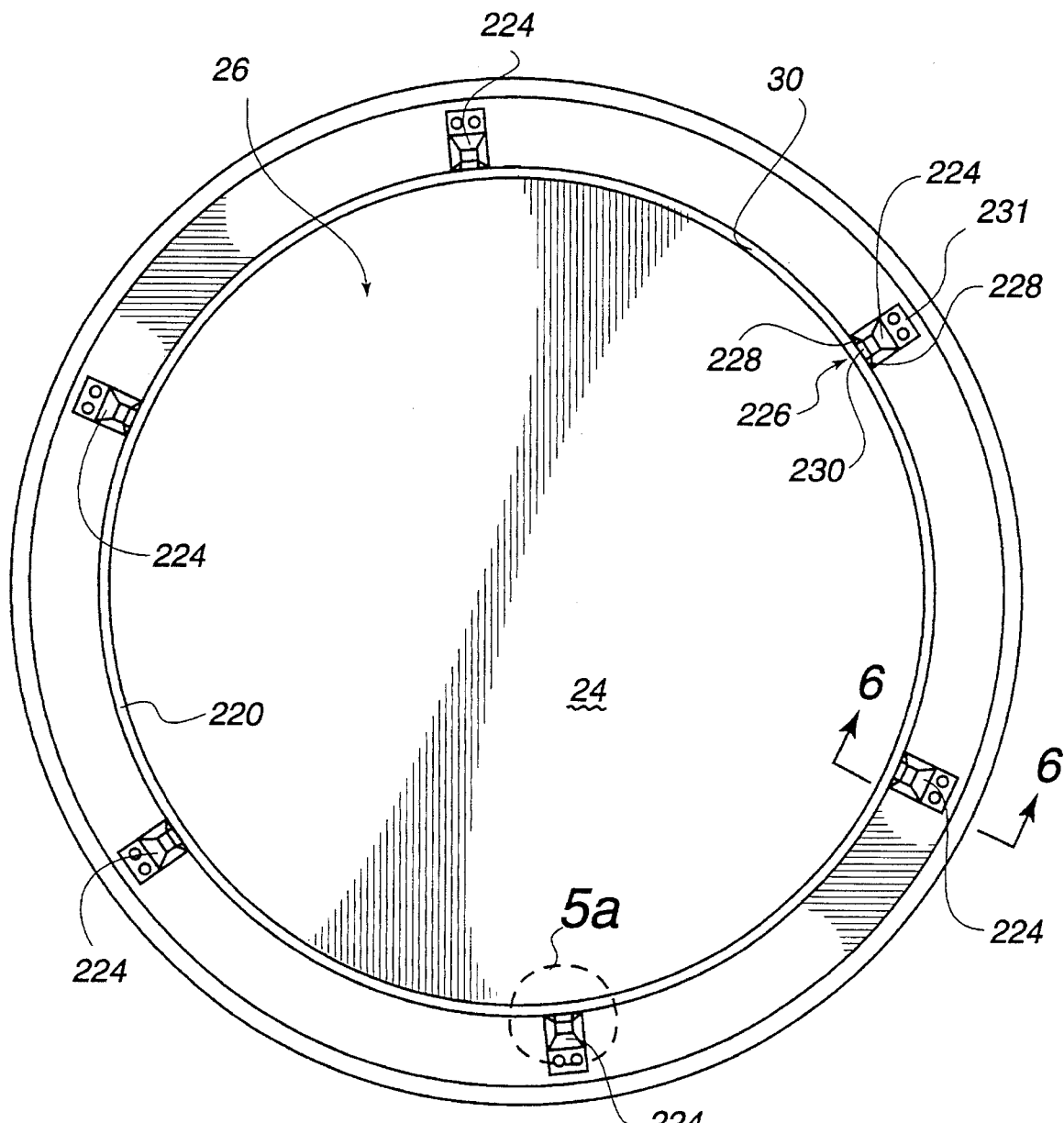
FIG. 5 is an additional top view of the heater pedestal of FIG. 4 illustrating receipt of a substrate thereon.
Figure 5A:
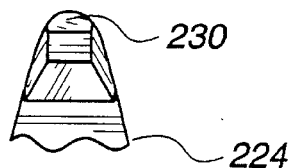
FIG. 5(a) is a detail of a guide per shown in FIG. 5.

Referring now to FIGS. 3 and 4, the vacuum supply to the vacuum chuck in the heater pedestal 18 is shown. Vacuum pipe 48 passes through stem 20 from the cover plate 43 on the lower distal end 42 of the stem to upper end 40 of the stem, and is connected through the connector housing 53 in the heater pedestal 18 to a plurality of vacuum ports 76 (FIG. 4) extending into a plurality of individual vacuum grooves 77, 78 in the floor 26 of the pocket. To supply the vacuum ports 76, a plurality of cross bores 75 are drilled into the heater pedestal 18 immediately below the floor 26, and these cross bores 75 all align into a corresponding bore in the connector housing 53. The vacuum pipe 48 terminates into the corresponding bore in the connector housing 53, and thus a vacuum is pulled through the vacuum pipe 48 from the grooves 77, 78.

The cover plate 43 and the sleeve 96 at the bottom of the stem 20 include aligned apertures to supply the purge gas and vacuum supplies into the purge gas pipe 52 and vacuum pipe 48 in stem 20, in addition to the apertures therethrough through which the thermocouple 56 and heater element connections extend. The purge gas supply, and the vacuum, are preferably supplied to the sleeve 96 through bellows tubing, which is connected into fittings threaded into the proper apertures in sleeve 96. To prevent leakage of the vacuum or purge gas at the interface of the cover plate 43 and the sleeve 96, a circumferential groove is provided about the interface of the aligned apertures through which the vacuum and purge gas supplies are maintained. The grooves are preferably located about the exit of the apertures from the upper end of the sleeve 96, and O-ring seals are located in the grooves to seal any gap between the cover plate 43 and the sleeve 96 at tho aligned apertures. The use of O-rings to seal the gas and vacuum apertures, in conjunction with the use of a blade connector 64 to connect the heating element to the power supply and tho use of a rigid rod as the thermocouple, permits relatively simple disassembly of the sleeve 96 from the stem 20.

The Heater Pedestal Positioning Assembly

The heater pedestal positioning assembly 34 for positioning the heater pedestal 18 at multiple locations within the chamber enclosure includes the stem 20 interconnected to the drive system 22. Stem 20 is connected to the underside of the heater pedestal 18, and extends outwardly of the base 16 to connect to the drive system 22. The drive system 22 includes a motor and reduction gearing assembly 82 suspended below chamber 13 and connected with a drive belt 84 to a conformable coupling and lead screw assembly 86. A transfer housing 88 is received on lead screw assembly 86, which is guided up and down and held against rotation by a linear slide 90. Transfer housing 88 extends about the circumference of stem 20, and is attached to the lower distal end 43 thereof through the end sleeve 96, to move and support stem 20 and heater pedestal 18 thereon. The motor actuates the lead screw assembly 86 to move stem 20 and heater pedestal 18 thereon. A seal ring 126 is provided in a groove in stem 20 to seal the outer surface of the lower end 42 of stem 20 in sleeve 96.

Heater pedestal 18 can droop or sag along its outer edge at the high temperatures used in CVD processing. To reduce the likelihood of such mechanical deformation at high CVD process temperatures, support sleeve 81 extends radially outwardly to support heater pedestal 18. Sleeve 81 includes a lower tubular portion 83, preferably formed of aluminum, received on a ledge 85 on stem 20. The ledge 85 may be formed, for example, by locating a snap ring in a groove in the stem 20, which projects radially from stem 20 adjacent stem lower distal end 42 or by machining a circumferential boss on stem 20. A spring 87 is received on ledge 85 to receive the base of lower tubular portion 83 thereon to upwardly bias sleeve 81. The upper end of sleeve 81 terminates in an outwardly radiating support flange 89, on which a support ring 91, preferably a ceramic ring with high resistance to sagging at elevated temperatures, is received. The flange 89 includes an inner circular alignment boss 93 and an outer, upwardly extending lip 95. The boss 93 extends into the central aperture in ring 91 to align the ring 91 on the boss 93. The support ring 91 is supported on the lip portion 95, to minimize the contact area between the support ring 91 and the sleeve 81. Additionally, a plurality of apertures extend through lip 95, which allow gasses trapped in the interior of the sleeve 81 to vent outwardly therethrough, along the underside of the support ring 91. Support ring 91 presses against the lower ring 21 of heater pedestal 18, and is maintained in contact therewith by the upward bias of spring 87. The ceramic does not lose strength at the elevated processing temperature, and thus the ring 91 supports the heater pedestal 18 against sagging. To protect the stem 20 and maintain a vacuum thereabout, a shroud 94 extends downwardly about stem 20 from the underside of chamber base 16 and terminates on lower end sleeve 96. Shroud 94 and the outer surface of stem 20 extending below aperture 100 form annulus 127 therebetween. The annulus 127 communicates with the interior of chamber 13 through aperture 100, and is thus maintained at the same vacuum pressure as chamber 13. Shroud 94 includes a pair of bellows 98, 99 and a transfer ring 102 which seals the area about the outer circumferential surface of the stem 20 from the atmosphere. Each bellows 98, 99, terminates in a support ring 106a–d. Each support ring 106a–d is a generally right circular member which includes an outwardly projecting support portion 112. On support rings 106a–c, a seal ring is disposed in projecting support portion 112 to seal the annulus 127 at the support rings 106a–c. The lower end of annulus 127 is sealed by the interconnection of sleeve 96 and transfer housing 88. Seal ring 126, disposed in stem distal end 42, seals the base of stem 20 to sleeve 96 and thus completes the sealing of annulus 127 from the atmosphere.

When a substrate is processed in reactor 10, the volatile reaction gas will migrate to the bottom of chamber 13, and then down through the aperture 100 and into contact with bellows 98, 99, transfer ring 102 and support rings 106a–d. The heat generated by the electric resistance heating element to heat the heater pedestal 18 for substrate processing conducts through stem 20 to heat bellows 98, 99, support rings 106a–d, drive system 22 and transfer ring 102. The heat radiated and conducted by the stem 20, in conjunction with the presence of the reactive gas, creates a corrosive environment for support rings 106a–d, transfer ring 102 and bellows 98, 99.

Chamber Component Protection System

To reduce the heating of the stem 20 by heating element within heater pedestal 18, the stem 20 is manufactured from one material, preferably an aluminum alloy such as 5086 or 5083 aluminum, and the heater pedestal 18 is manufactured from a pure aluminum, preferably an 1100 aluminum, or other aluminum material having at least 99% Al and less than 0.05% Mg. The 1100 aluminum material may be used in the CVD environment, and need not be anodized. The aluminum material of stem 20 preferably has a smaller coefficient of thermal conductivity than the heater pedestal 18, and thus transmits heat from heater pedestal 18 less efficiently than would a stem of pure aluminum. Additionally, a heat choke portion 44, with a reduced cross-section and preferably 4" in length, is provided on stem 20 adjacent heater pedestal 18, through which a sufficient temperature gradient may be established between heater pedestal 18 and the lower distal end of stem 20 so that a low-cost fluoroelastomer material such as Viton® material may be used in seal 126.

To reduce the temperature of the components below the chamber 13 which are otherwise raised by the heat which is transferred down stem 20 past heat choke portions 44, and to quickly reduce the temperature of the entire assembly when servicing is necessary, water may be provided to coolant passages provided within sleeve 96. Alternatively, a water jacket may be placed around the sleeve 96, or transfer case 88 and transfer ring 102, to help cool these components during and after substrate 24 processing. Further, a cooling fan may be used to pass air over the components to increase heat transfer therefrom.

To limit the introduction of reactive gas into annulus 127 about stem 20 and shroud 94, sleeve 96 also includes a purge gas manifold 97 formed at the interface of the sleeve 96 and the lower support ring 106d, into which a supply of purge gas, such as Argon, may be provided. The purge gas flows outwardly from the manifold 97, from a plurality of holes spaced about the manifold 97, preferably 8 to 12 holes, and then upwardly through annulus 127, to maintain a gas barrier against entry of reactive gasses through aperture 100 into annulus 127. The flow of purge gas through the manifold 97 is preferably maintained at a flow rate which will maintain laminar plug flow of purge gas upwardly in the annulus 127. By maintaining these conditions, the diffusion of the reactive gas downwardly through the aperture 100 will be substantially eliminated. Additionally, during processing, the purge gas passes up through aperture 100 and about the outer edge of the heater pedestal 18 to minimize the passage of reactive gas down about the sides of heater pedestal 18. This reduces the amount of reactive gas which reaches the interior surfaces of the structural components of the chamber, and the underside of the heater pedestal 18, to reduce the amount of unwanted material deposition which may occur on these surfaces.

The Substrate Positioning Assembly

Stem 20 moves upwardly and downwardly through the aperture 100 in base 16 of chamber 13, to move heater pedestal 18 to receive a substrate 24 within the pocket 280 and, after processing, to move heater pedestal 18 into a position where the substrate 24 may be removed from the chamber 13 by a robot blade. To selectively support the substrate 24 in a position above the heater pedestal 18, the substrate positioning assembly 140 includes a plurality of support pins 25 which move vertically with respect to heater pedestal 18 to support the substrate 24 in position to be placed in, or removed from, the chamber 13, and to locate the substrate 24 on the heater pedestal 18. The support pins 25 are received in sleeves in bores 130 disposed vertically through heater pedestal 18. Each pin 25 includes a cylindrical shaft 132 terminating in a lower spherical portion 134 and an upper truncated conical head 136 formed as an outward extension of shaft 132. Bore 130 includes an upper, countersunk portion 138 sized to receive enlarged head 136 therein such that when pin 25 is fully received into heater pedestal 18, head 126 does not extend above the surface of heater pedestal 18.

Referring now to FIGS. 2 and 3, support pins 25 move partially in conjunction with, and partially independently of, heater pedestal 18 as heater pedestal 18 moves within chamber 13. Support pins 25 must extend from heater pedestal 18 to allow the robot blade to remove the substrate 24 from the chamber 13, but must also sink into heater pedestal 18 to locate the substrate 24 on the floor 26 of the pocket 280 for processing. To provide this positioning, a substrate positioning assembly 140 is normally biased upwardly into chamber 13, but is also moveable downwardly by the stem 20 as stem 20 moves to actuate heater pedestal 18 downwardly in chamber 13.

Substrate positioning assembly 140 includes an annular pin support 142 which is configured to engage lower spherical portions 134 of support pins 25, and a drive member 144 which positions pin support 142 to selectively engage support pins 24 depending upon the position of heater pedestal 18 within chamber. Pin support 142 includes an upper pin support ring 146, preferably made from ceramic, which extends around the underside of heater pedestal 18 to selectively engage the lower spherical portions 134 of support pins 25, and a sleeve portion 150 which extends downwardly from pin support ring 145 through aperture 100 to terminate on transfer ring 102. Transfer ring 102 is disposed circumferentially about stem 20, and is keyed to slide 90 to prevent rotation thereof.

The sleeve portion 150 includes a lower cylindrical portion 149, an outwardly extending radial support 151 which receives and supports pin support 146 thereof. The radial support 151 includes an upper, generally flat, upper surface having a circumferential alignment wall 153 which aligns with the inner diameter of the annular pin support 146 and a plurality of upwardly supporting support ribs 155 which support the underside of the pin support ring 146. During the operation of the reactor 10, gases may become trapped along the interior cylindrical portion 149, which could damage the chamber components. To relieve these gases, a plurality of gaps 157 are formed adjacent the support ribs 155, and a plurality of holes 159 are formed through lower cylindrical portion 149. The holes 159 and gaps 157 allow the free flow of gases from the interior to the exterior of the sleeve 150.

Pin drive member 144 is located on the underside of chamber 13 to control the movement of sleeve portion 150 with respect to heater pedestal 18, and includes therefore a spring assembly 156 which is connected to transfer ring 102 to provide the upward bias on transfer ring 102 and sleeve portion 150 to bias pin support ring 146 upwardly to push the support pins 25 upwardly through the heater pedestal 18, and the snap ring or ledge 84 on stem 20 which is selectively engageable with sleeve 150 to move sleeve portion 150 and pin support ring 146 attached thereto downwardly after heater pedestal 18 has moved a preselected distance downwardly in chamber 13. Spring assembly 156 includes a housing 158 having a slot 150 therethrough, which is attached to the underside of the chamber 13 adjacent aperture 100. A spring-loaded finger 154 extends through slot 160, and is upwardly biased by a spring 164 in housing 158. Finger 154 is rigidly connected to transfer ring 102, and thus upwardly biased sleeve 150 is attached thereto. The upper terminus of housing 158 limits the upward movement of finger 154. Transfer ring 102 is also rigidly connected to support ring 106c, which includes a downwardly extending tubular portion which terminates in an inwardly extending flange 173. The ledge 85, which supports sleeve 81 on stem 20, is also engageable against flange 173 as stem 120 moves downwardly.

When heater pedestal 18 is fully upwardly extended in chamber 13 for processing, finger 154 is fully actuated against the upper end of housing 158, and pin support ring 146 is disposed below heater pedestal 18 such that the lower spherical portions 134 of support pins 25 are spaced therefrom. When processing is completed, stem 20 moves downwardly to move heater pedestal 18 downwardly in chamber 13. As this movement continues, lower spherical portions 134 of pins engage pin support ring 146. At this point, finger 154 is biased against the top of housing 158 and both the finger and the pin support ring 146 coupled thereto remain stationary. Thus, once lower spherical portions 134 engage pin support ring 146, support pins 25 remain stationary and support the substrate 24 in a stationary position within chamber as heater pedestal 18 continues moving downwardly. After a preselected amount of heater pedestal 18 travel, the ledge 85 on stem 20 engages flange 173, which locks stem 20 to sleeve 150 and causes heater pedestal 18 and pin support ring 146 to move downwardly in unison. Once the ledge 85 engages flange 173, the support pins 25 remain stationary with respect to heater pedestal 18, and both elements move downwardly in chamber 13. Once heater pedestal 18 and substrate 24 suspended thereover on support pins 25 are in the proper position, the robot blade enters through the slit valve 11, removes the substrate 24, and places a new substrate 24 on support pins 25. Stem 20 then moves to move sleeve 150 and heater pedestal 18 upwardly. When finger 154 engages the top of housing 158 sleeve 150 becomes stationary, while ledge 85 moves off flange 173 as stem 20 continues moving upwardly, and thus continued movement of heater pedestal 18 sinks support pins 25 therein to position the substrate 24 thereon for processing. By moving the support pins 25 partially in conjunction with, and partially independently of, the heater pedestal 18, the overall length of the support pins 25 may be minimized, and the length of the pin shaft 132 which is exposed below the heater pedestal 18 and support ring 91 during processing is equal to the distance from the heater pedestal 18 that the substrate 24 is located when the substrate 24 is being manipulated on and off the support pins 25 by the robot blade. Thus, minimal support pin 25 surface area is exposed during processing, and therefore minimal deposits will occur on the support pins 25.

The Vacuum Clamping System

Referring now to FIGS. 2 and 4, the vacuum clamping mechanism of the present invention is shown. The floor 26 of the pocket 280 includes a plurality of concentric grooves 78 therein, which intersect a plurality of radial grooves 77 and are disposed to communicate between the base of each radial groove 77 and the circular vacuum manifold 75 disposed within heater pedestal 18. Vacuum pipe 48 communicates with manifold 75 to supply the vacuum thereto.

Vacuum ports 76 and grooves 77, 78 provide a low pressure environment under the substrate 24 to draw the substrate 24 onto the floor 26. During processing, chamber 13 is typically maintained at about 80 torr. To draw the substrate to heater plate top surface during processing, a vacuum of 1.5 torr to 60 torr is drawn through ports 76 to grooves 77, 78. The 20 to 78.5 torr pressure differential between grooves 77, 78 and chamber 13 causes the substrate 24 to adhere to the pocket floor 26 to increase the heat transfer from the heater pedestal 18 to the substrate 24.

After processing, grooves 77, 78 may maintain a lower pressure than that present in chamber 13, which may firmly adhere chuck the substrate 24 to heater pedestal 18 of the upper surface. In that instance, support pins 25 can crack the substrate as it is forced off the heater pedestal 18. To equalize the pressure existing in grooves 77, 78 with that existing in chamber 13, a bypass line may be provided between the vacuum pipe 48 inlet and the chamber slit valve 11. When the pedestal is actuated to allow for the removal of the substrate 24 from the reactor 10, the bypass line is opened to communicate between the grooves 77, 78 and the chamber 13. Pocket floor 26 may also include a groove, or plurality of grooves, located adjacent the outer circumference thereof which are not connected to the vacuum. These grooves reduce the area of contact between the substrate 24 and heater pedestal 18, which reduces the heat transfer to, and thus deposited film thickness on, the substrate edge 27.

During sequential processing of substrates, it has been found that substrates 24 may become sufficiently misaligned, with respect to the chamber components, that the substrate 24 may be tipped with respect to the pocket floor. Additionally, a substrate 24 may be cracked or warped. In each instance, the continued processing of the substrate 24 can allow the processing gas to contact the internal areas of the heater pedestal 18 which can effect the integrity of the heater pedestal 18, can create particles, or can free portions of the cracked substrates into the chamber. In these instances, it is desirable to immediately stop the processing to remove the substrate 24 before chamber damage occurs.

It has been found that in the situation where a substrate 24 is misaligned, cracked or warped, the vacuum pressure at the inlet to the vacuum pump, which maintains the vacuum pressure in grooves 77, 78 in the heater pedestal 18, will change from that which is present when a flat, complete and properly positioned substrate is on the heater pedestal 18. A pressure sensor 49 is located in the vacuum line at the inlet to the vacuum pump to transmit a signal to a shut down controller, which shuts down chamber operation when the vacuum pressure is indicative of a cracked, warped or misaligned substrate. When a substrate 24 is properly received on the heater pedestal 18, and the enclosure is maintained at about 80 torr, the pressure at the vacuum pump inlet, and thus at the sensor 49, will be 1 to 2 torr. Where a substrate 24 which is substantially misaligned, or substantially warped is received on the upper surface 26, the sensor 49 pressure will approach less than 5 torr. With a cracked substrate, the pressure will range from 10 torr up to the chamber pressure.

The Substrate Edge Protection System

Referring to FIGS. 5, 5(a), 6 and 7(a) and (b), the preferred embodiment of the substrate edge protection system 30 is shown. When a substrate is located on the pocket floor 26 of heater pedestal 18, the substrate edge protection system 30 supplies a gas which passes about the perimeter of the substrate 24 to prevent material deposits on that area of the substrate 24.

Figure 7A:
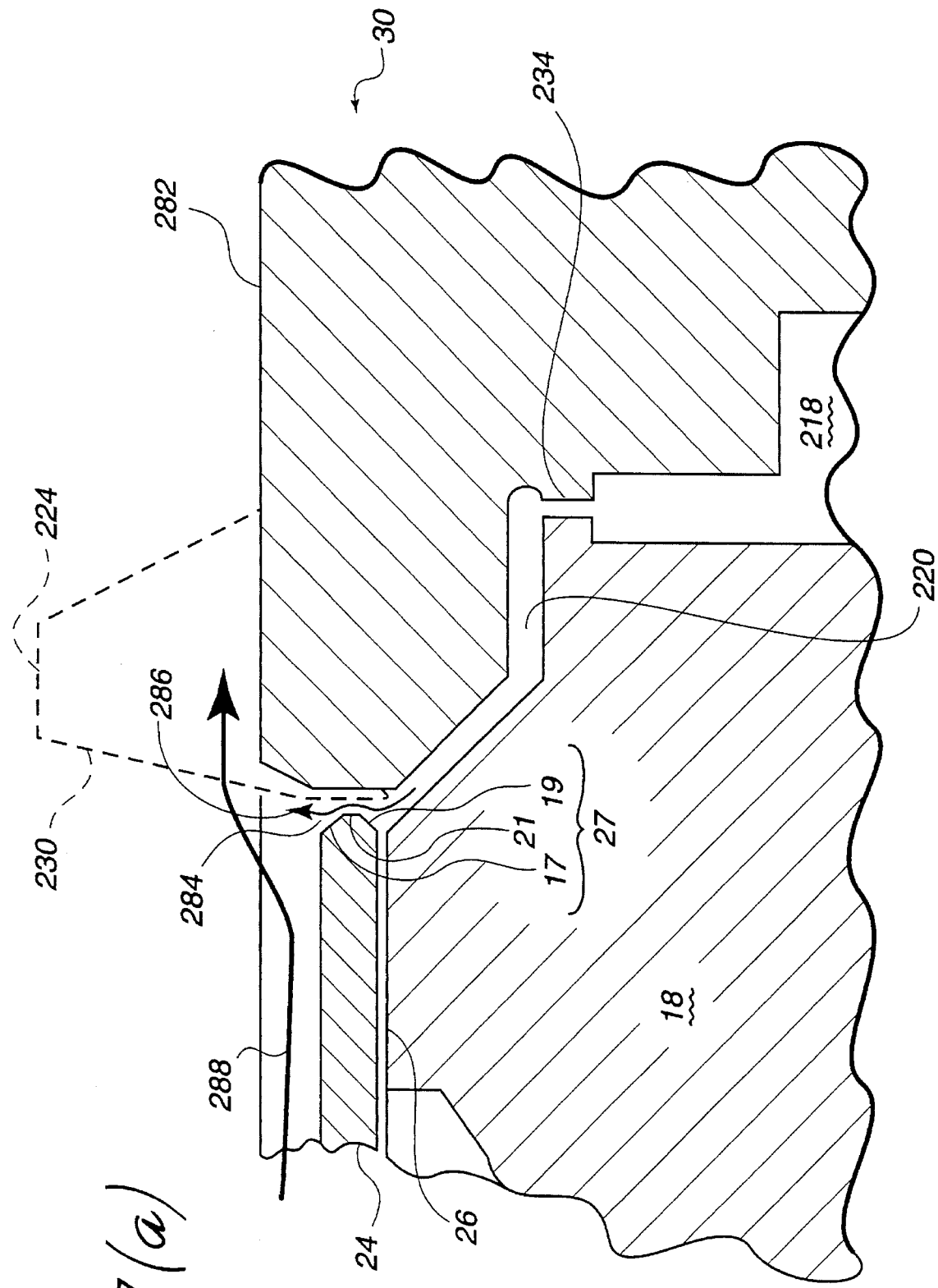
FIGS. 7(a) and (b) are an enlarged, partial sectional views of the heater pedestal illustrating two configurations of how deposition is prevented on the substrates edge.
Figure 7B:
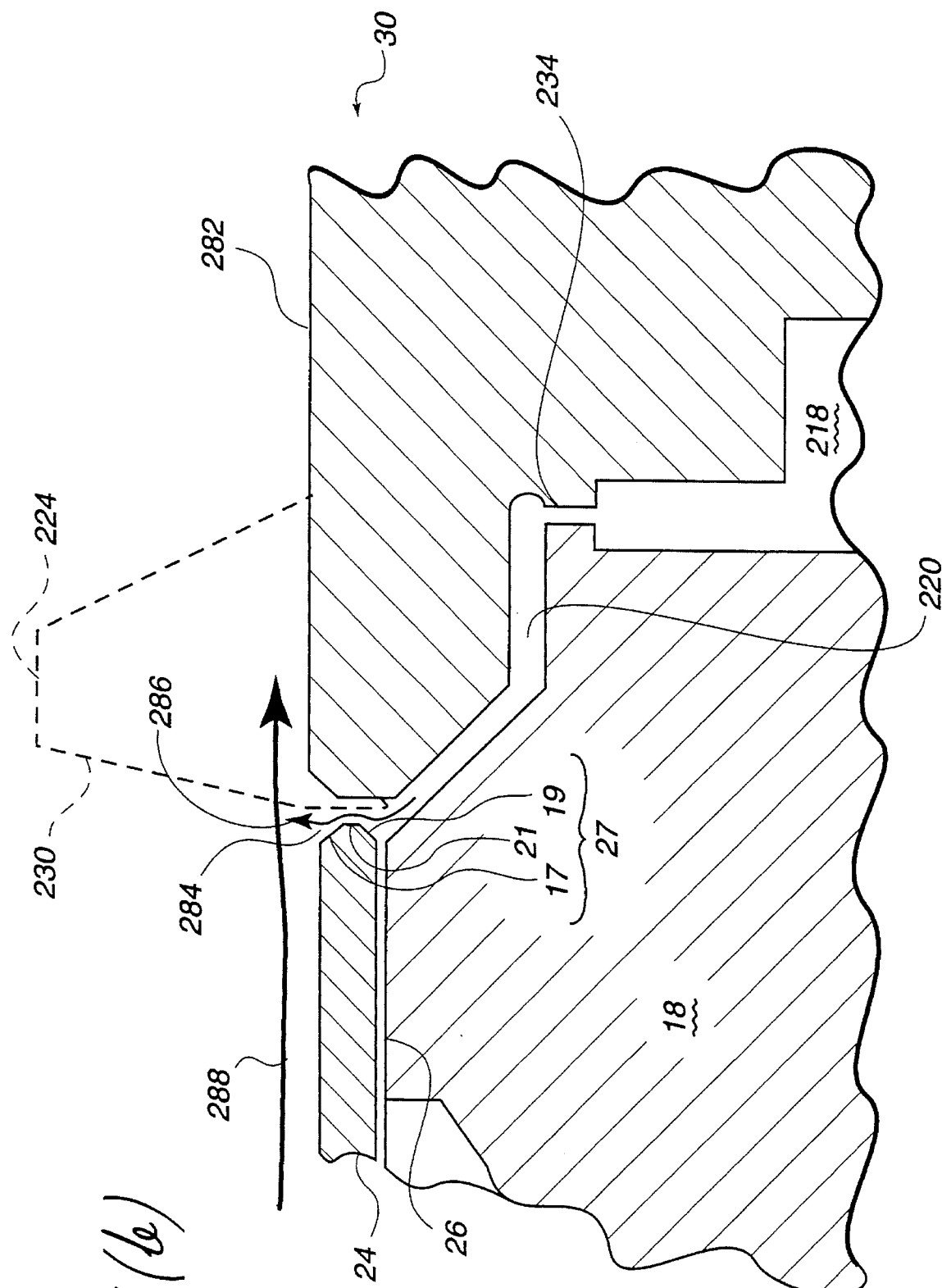

As is more clearly illustrated in FIGS. 7(a) and (b), substrate 24 has a beveled circumferential edge 27 which includes an upper tapered surface 17, a lower tapered surface 19 and a generally flat middle circumferential portion 21. To limit the occurrence of defects caused by the dislodging of deposits on the edge 27 and underside of the substrate 24, but simultaneously maximize the number of useful dies produced by the substrate 24, the deposition layer should be evenly deposited all the way to the edge 27 of the substrate, but not occur on the underside, lower tapered surface 19 or flat middle portion 21 of the substrate 24 where it may contact other materials and become dislodged. The substrate edge protection system 30 of the present invention addresses this requirement.

As is illustrated in FIGS. 6, 7(a) and (b), the inner edge of the circumscribing hoop 282 provides the outer upright walls of the pocket 280. The hoop 282 thereby defines a pocket capable of receiving the substrate 24 from above and an annulus 284 between the outer edge 27 of the substrate and the inner "pocket" wall of the hoop 282. Typically, the annulus is about 0.015" wide when the pedestal is fully heated. The height of the walls of the pocket should be at least as high as the substrate is thick (FIG. 7(b)). Preferably the walls are about twice as high as the substrate is thick (FIG. 7(a)).

Further, a purge gas channel 220, to supply a relatively constant supply of purge gas about the entire perimeter of substrate 24, is defined between the main body of the pedestal 18 and the hoop 282. Purge gas channel 220 is in the form of an inwardly and upwardly extending groove, disposed at an approximately 45° angle from floor 26, to exit at the interface of floor 26 and the base of the circumscribing hoop 282, i.e., the outer bottom edge of the pocket 280.

Although the figures illustrated an embodiment suitable for use with a circular susceptor, it should be noted that the channel 220 should follow the perimeter of the substrate. Accordingly, if a non-circular substrate (such as a wafer with a "wafer flat" formed in it) is being processed, the channel should be formed to follow the irregular perimeter. A plurality of purge gas holes 234 are disposed between the inner terminus of purge gas channel 220 and the purge gas manifold 218, and are evenly spaced circumferentially about the heater pedestal 18 to supply the purge gas from manifold 218 into channel 220. The number of holes 234 is dependent upon the intended circumferential distance surrounding the substrate edge. For 200 mm wafer the number of holes is approximately two hundred and forty. As the wafer size decreases the number of holes necessary to provide a constant flow of purge gas at substrate edge 27 decreases. For 150 mm wafer, the holes can be reduced to 180 in number.

To precisely position the substrate edge 27 adjacent channel 220 for processing, the preferred substrate alignment system 32 includes a plurality of ceramic guide pins 224 disposed in recesses formed in the circumscribing hoop 282 adjacent channel 220. Each pin 224 includes a front portion 226 tapered approximately 12° from the vertical. Front portion 226 includes a generally flat extending central portion 230, and tapered sides 228, such that central portion 230 extends further inward heater plate upper surface 26 than tapered sides 228. As is particularly apparent from the detail in FIG. 5(a), the leading edge (i.e., the edge that contacts the substrate) of the central portion 230 of each pin 224 is formed with a generally arcuate surface so as to reduce the interference of the pin with the flow of purge gas. Furthermore, this arcuate leading edge of the pin is designed to contact the outer perimeter of the substrate at a point about 0.005" from the lower surface of the substrate. As shown in FIG. 7, central portion 230 extends inwardly from the inner wall of circumscribing hoop 282 and over purge gas channel 220. Each pin 224 also includes a rearwardly extending mounting tab 231, which includes a pair of holes therein for receipt of bolts to secure the pin 224 within a recess in hoop 282.

The guide pins 224 are located on heater pedestal 18 such that extending central portions 230 of the pins 224 protrude inwardly of the pocket wall to points approximately five thousandths of an inch from substrate flat middle circumferential portion 21 when substrate 24 is perfectly aligned to the center of heater pedestal 18. Thus, in the instance where the substrate 24 is perfectly aligned, the substrate 24 will come into contact with pocket floor 26 without touching any of pins 234. When so positioned, and as described previously, an annulus 284 is defined between the outer edge of the substrate and the inner edge of the circumscribing hoop 282. However, most substrates have a slight amount of eccentricity, and the robot blade does not always perfectly center the substrate 24 on floor 26. In those instances, lower tapered surface 19 and flat middle circumferential portion 21 of substrate 24 will engage one, or more, extending portions 230 of guide pins 224, and the guide pins 224 will align the substrate into position on upper surface 26 so that edge 27 does not restrict purge gas channel 220. By positioning the substrate 24 with guide pins 224, the only portion of the substrate 24 which touches the alignment mechanism is that small portion of edge 27 in contact with guide pin central portion 230. In addition, as illustrated in FIG. 7 and to ensure that a misaligned or eccentric substrate does not engage the circumscribing hoop 282, the upper, inner edge of the hoop is angled back at an angle of about 15 degrees, i.e. 3 degrees greater than the slope of the face of the pins 224. As central portion 230 extends radially inwardly from purge gas channel 220, substrate edge 27 will locate a small distance from the channel 220, and the area of substrate 24 to each side of the contact area of substrate 24 with central portion 230 will receive an uninterrupted supply of purge gas.

During processing, purge gas is supplied to the channel 220 to flow upwardly through the annulus 284. This flow of purge gas, which is indicated by arrow 286 in FIG. 7, in conjunction with the inner wall of the pocket, prevents deposition gas from coming into contact with the flat edge 17 and sloping lower edge 19 of the substrate 24. The purge gas for a typical Tungsten CVD process is usually an Argon/Hydrogen mixture with Argon gas supplied at between 1000 and 2000 cm$^3$ per minute flow rate and H$_2$ gas supplied at 200 to 500 cm$^3$ per minute. The Argon functions to prevent the WF$_6$ deposition gas from coming into contact with the substrate edge. The H$_2$ gas, on the other hand, functions to enhance the deposition build-up at the edge of deposition layer.

The supposed flow patterns of the purge and deposition gasses are indicated in FIGS. 7(a) and (b). As is indicated by arrow 286, the purge gas moves upwardly through annulus 284. The deposition gas, indicated by arrow 288, has a generally laminar flow across the surface of the substrate from its central region towards its perimeter. Because the height of the pocket wall, illustrated in FIG. 7(a) is equal to or greater than the substrate thickness, the deposition gas "ramps" up over the top of the circumscribing hoop 282 to be evacuated through the exhaust system described below. At this point it should be mentioned that the exact height of the wall (depth of pocket) may vary and the embodiments of wall height being twice that of wafer thickness (FIG. 7(a)) or equal to wafer thickness (FIG. 7(a)) are illustrative only. It should, however, not be so great that the laminar flow 288 of deposition gas is disrupted into turbulent flow as this could, notwithstanding the flow of purge gas 286, cause unwanted edge and under side deposition. At the same time, the pocket wall should be high enough so that in conjunction with the purge gas, the deposition gas.

When the substrate 24 is first received on heater pedestal 18, the temperature thereof may be substantially lower than the heater pedestal 18 temperature. Once the substrate 24 comes into contact with the heater pedestal 18, heat is conductively transferred into the substrate 24 to raise its temperature to the processing temperature. This temperature increase causes thermal expansion of the substrate 24, such that edge 27 thereof may press against alignment pins 224. Further, the vacuum in grooves 77, 78 firmly draw the substrate 24 to the pocket floor 26, such that the edge 27 of substrate 24 may become compressively loaded against pin 224. As a result of this loading, the substrate 24 can crack or chip where it touches alignment pin 224. To minimize the occurrence of chipping or cracking at the substrate edge 27, the chamber controller may be programmed to maintain the chamber pressure in the vacuum grooves 77, 78 during the period when the substrate 24 is heated, and then pull a vacuum through the grooves 77, 78 after the substrate 24 reaches a stable temperature. The presence of chamber pressure underneath the substrate 24 allows the substrate to expand away from the area of contact with alignment pin 224, thus reducing localized compressive stresses and reducing the incidence of compressive cracking or chipping on the substrate edge 27. Additionally, purge gas may be backflushed through vacuum grooves 77, 78 as the substrate 24 is received in the pocket 280 to help align the substrate 24 and reduce frictional adhesion of the substrate 24 to support pins 25 as guide pins 224 guide the substrate 24 into position, or gas may be backflushed through the grooves 77, 78 as the substrate 24 thermally expands to allow the substrate 24 to expand away from pins 224 when received in the pocket 280.

The Chamber Exhaust System

Referring again to FIGS. 2 and 3, an exhaust system 300 is shown. The top 12 of reactor 10 includes a prior art manifold 23 which leads to the exhaust port 304 of the chamber 40. Suction through the exhaust port 304 pulls exhausted chamber gasses out of chamber 13 to maintain the proper processing environment in chamber 13. Manifold 23 extends substantially around the perimeter of top 14, but a gap remains where wall 16 is pierced by the slit valve 11. This gap creates uneven exhausting and thus uneven chamber processing gas distribution throughout the enclosure 11. In accordance with the invention, a pumping plate 308, with a plurality of apertures 29 evenly spaced thereabout, is mounted over manifold 23. Apertures 29 are spaced apart approximately 30 degrees, and an aperture 29 is spaced at each end of manifold 23 adjacent the gap. The evenly spaced apertures in pumping plate 308 create even exhausting of used chamber processing materials, which leads to the creation of a more uniform deposition layer on the substrate 24.

Conclusion

The foregoing embodiments of the invention provide a CVD chamber which yields a more uniform deposition material layer on the substrate, while simultaneously reducing the incidence of particle generation during processing. By eliminating the shadow ring which touches the substrate during processing, the overall yield of die from the substrates is increased by eliminating the masked edge of the substrate created by the shadow ring.

Additionally, the apparatus substantially reduces unwanted edge and underside deposition on the substrate. This, in turn, reduces particulate contaminants originating from unwanted edge/underside deposition that inadequately adheres to the substrate.

The structure of the improved CVD chamber also leads to reduced particle generation. Rubbing of the substrate 24 on the heater pedestal 18 is reduced, by reducing the frictional adhesion of the substrate 24 and heater pedestal 18 as the substrate is received thereon.

Although specific details have been described for use with the present invention, those skilled in the art will recognize that the details, and the arrangement of the specifically described components of the invention, may be changed without deviating from the scope of the invention. Additionally, although the invention has been described for use in a thermal CVD chamber, the components herein are equally suited for use in plasma deposition and other substrate processing operations.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

Although the foregoing invention has been described in some detail by way of illustration and example for purposes of clarity of understanding, it would be obvious that certain changes and modifications may be practiced within the scope of independent claims.

What is claimed is:

1. An apparatus for processing a generally planar substrate including a circumferential edge and a first face for processing and a second face, comprising:
   (i) a housing defining a substrate processing chamber;
   (ii) a substrate support disposed in the chamber for receiving a substrate for processing thereon;
   (iii) a substrate receiving pocket defined by the substrate support and including a floor for supporting the substrate and a wall, the receiving pocket being sized to expose the entire first face for processing; and
   (iv) a gas inlet positioned to direct a gas along the circumferential edge of the substrate when the substrate is received in the pocket.

2. The apparatus of claim 1, wherein said gas inlet includes a channel formed in the floor of the pocket, the channel extending about the circumference of the substrate when the substrate is received in the substrate receiving pocket.

3. The apparatus of claim 2, wherein the channel is formed at an intersection between the wall and floor of the pocket.

4. The apparatus of claim 1, wherein the wall is arranged generally perpendicular to the floor of the pocket.

5. The apparatus of claim 4, wherein the wall is at least as high as a maximum thickness of the substrate.

6. The apparatus of claim 4, wherein the wall is as high a maximum thickness of the substrate.

7. The apparatus of claim 5, wherein the wall has a height greater than the maximum thickness of the substrate.

8. The apparatus of claim 5, wherein the wall is about twice as high as the maximum thickness of the substrate.

9. The apparatus of claim 4, wherein the wall has a height such that when a laminar flow of a processing gas flows in a direction from a central region of the substrate and over the wall, the flow is maintained substantially laminar and nonturbulent.

10. The apparatus of claim 8, wherein the wall has an upwardly and outwardly sloping upper portion.

11. The apparatus of claim 10, wherein the sloping upper portion slopes at about 15° back from the vertical.

12. The apparatus of claim 1, further comprising a substrate alignment system.

13. The apparatus of claim 12, wherein the alignment system includes a plurality of alignment protrusions disposed on the substrate support to align a substrate received on said substrate support member within the pocket.

14. An apparatus for processing a generally planar substrate including a circumferential edge and a first face for processing and a second face, comprising:
   (i) a housing defining a substrate processing chamber;
   (ii) a substrate support disposed in the chamber for receiving a substrate for processing thereon;
   (iii) a substrate circumscribing hoop including an inner face, the hoop being sized to circumscribe the entire substrate whereby an annulus is defined between the substrate edge and the hoop inner face for exposing the entire first face of the substrate for processing; and
   (iv) a gas inlet positioned to direct a gas through the annulus.

15. The apparatus of claim 14, wherein the gas inlet includes a channel extending about the circumference of the substrate when the substrate is received on the substrate support.

16. The apparatus of claim 15, wherein the hoop inner face is arranged generally perpendicular to a primary plane of the substrate.

17. The apparatus of claim 16, wherein the hoop inner face is at least as high as a maximum thickness of the substrate.

18. The apparatus of claim 17, wherein the hoop inner face is about twice as high as the maximum thickness of the substrate.

19. The apparatus of claim 18, further comprising a substrate alignment system.

20. The apparatus of claim 19, wherein the alignment system includes a plurality of alignment protrusions disposed on the substrate support to align a substrate received on the substrate support member with respect to the circumscribing hoop to define the annulus.

21. A method of processing a substrate including a circumferential edge and a first face for processing and a second face, the method comprising the steps of:

(i) providing a substrate support for receiving the substrate in a processing chamber;

(ii) defining an annulus about the circumferential edge with a substrate circumscribing hoop to expose the entire first face of the substrate to a processing gas; and (iii) passing a gas through the annulus to prevent the processing gas from contacting the circumferential edge of the substrate.

22. The method of claim 21, wherein the annulus is defined by a circumscribing hoop including an inner face which is at least as high as a maximum thickness of the substrate.

23. The method of claim 21, wherein the annulus is defined by a circumscribing hoop including an inner face which is as high as a maximum thickness of a substrate.

24. The method of claim 21, wherein the annulus is defined by a circumscribing hoop including an inner face which is about twice as high as a maximum thickness of the substrate.

25. The method of claim 24, further comprising the step of aligning the substrate with respect to the circumscribing hoop.

* * * * *